United States Patent
Komatsu et al.

(10) Patent No.: US 9,035,725 B2
(45) Date of Patent: May 19, 2015

(54) ACOUSTIC WAVE DEVICE

(71) Applicant: Panasonic Corporation, Osaka (JP)

(72) Inventors: Tomoya Komatsu, Osaka (JP);
Tomohiro Iwasaki, Shiga (JP);
Hiroyuki Nakamura, Osaka (JP);
Masahiro Yasumi, Osaka (JP);
Kazunori Nishimura, Kyoto (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/183,528

(22) Filed: Feb. 19, 2014

(65) Prior Publication Data

US 2014/0285287 A1    Sep. 25, 2014

(30) Foreign Application Priority Data

Mar. 25, 2013   (JP) ................... 2013-061410

(51) Int. Cl.
*H03H 9/00*    (2006.01)
*H03H 9/25*    (2006.01)

(52) U.S. Cl.
CPC ................... *H03H 9/25* (2013.01)

(58) Field of Classification Search
CPC ........ H03H 9/64; H03H 9/6413; H03H 9/725
USPC ................... 333/193, 194, 195, 196
See application file for complete search history.

(56) References Cited

U.S. PATENT DOCUMENTS

| 7,939,989 | B2 * | 5/2011 | Solal et al. ............... 310/313 B |
| 8,531,255 | B2 * | 9/2013 | Loseu .......................... 333/195 |
| 8,698,578 | B2 * | 4/2014 | Nakanishi et al. ........... 333/133 |
| 2011/0068655 | A1 | 3/2011 | Solal et al. |

FOREIGN PATENT DOCUMENTS

JP    2011-101350    5/2011

* cited by examiner

*Primary Examiner* — Jeffrey Zweizig
(74) *Attorney, Agent, or Firm* — Lando & Anastasi, LLP

(57) ABSTRACT

An acoustic wave device includes a piezoelectric substrate, an interdigital transducer (IDT) electrode provided on an upper surface of the piezoelectric substrate, a first dielectric film covering the upper surface of the piezoelectric substrate to cover the IDT electrode, and a second dielectric film covering an upper surface of the first dielectric film. The second dielectric film includes a thin portion positioned in a tip region of electrode fingers of the IDT electrode and a thick portion which is positioned in a middle region of the IDT electrode and is thicker than the thin portion. The acoustic wave device suppresses spurious emission and has superior passband characteristics.

10 Claims, 11 Drawing Sheets

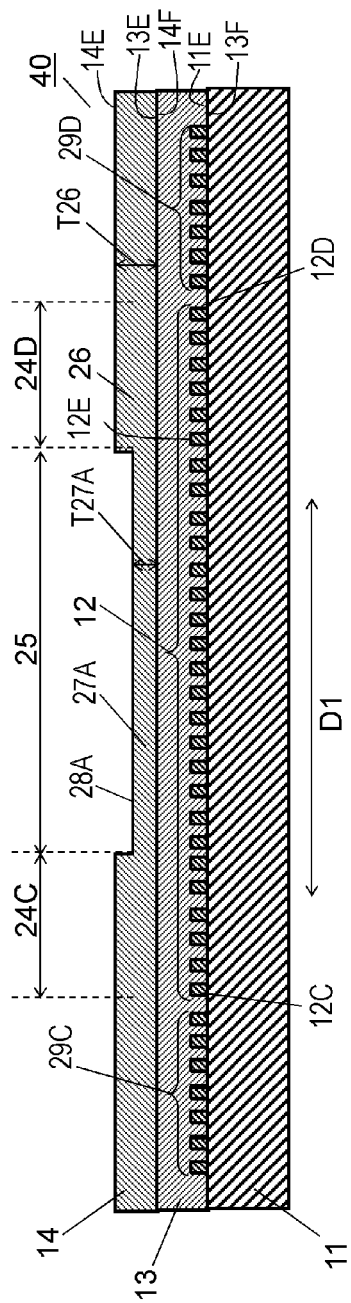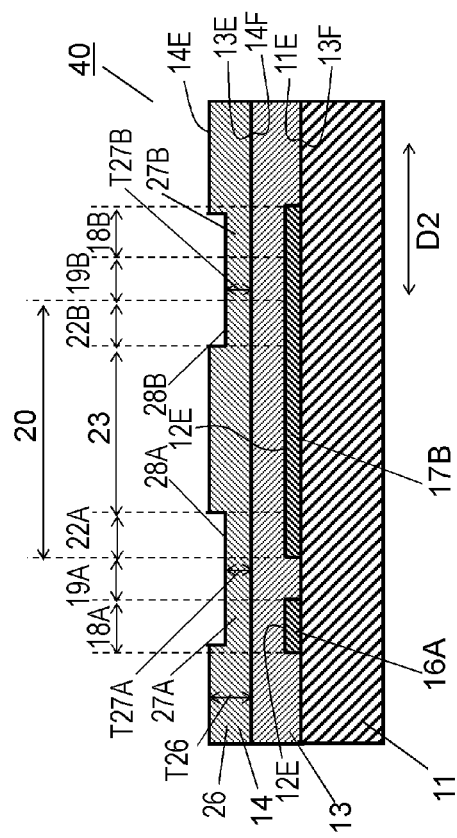
Fig. 4A
Fig. 4B

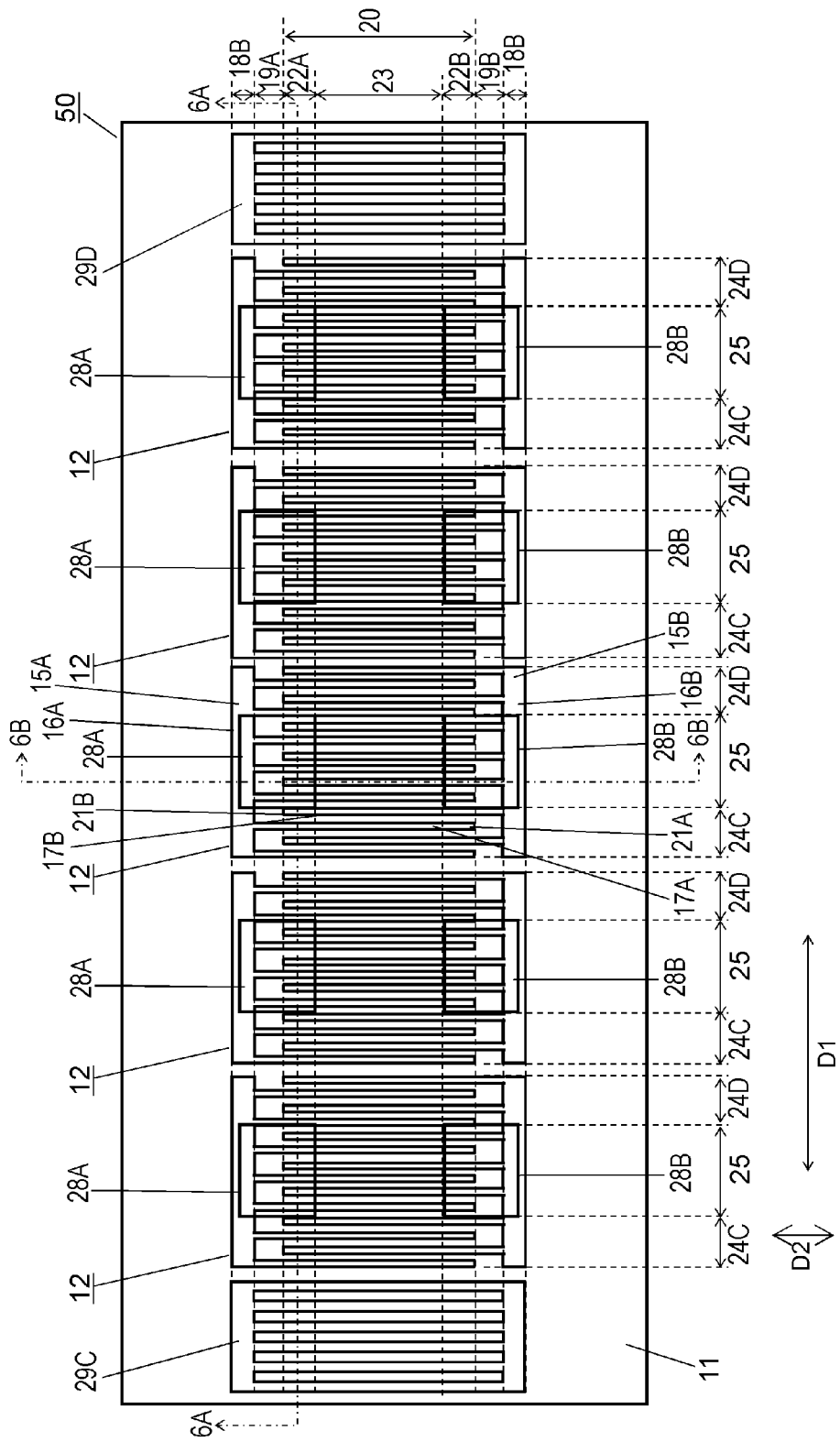

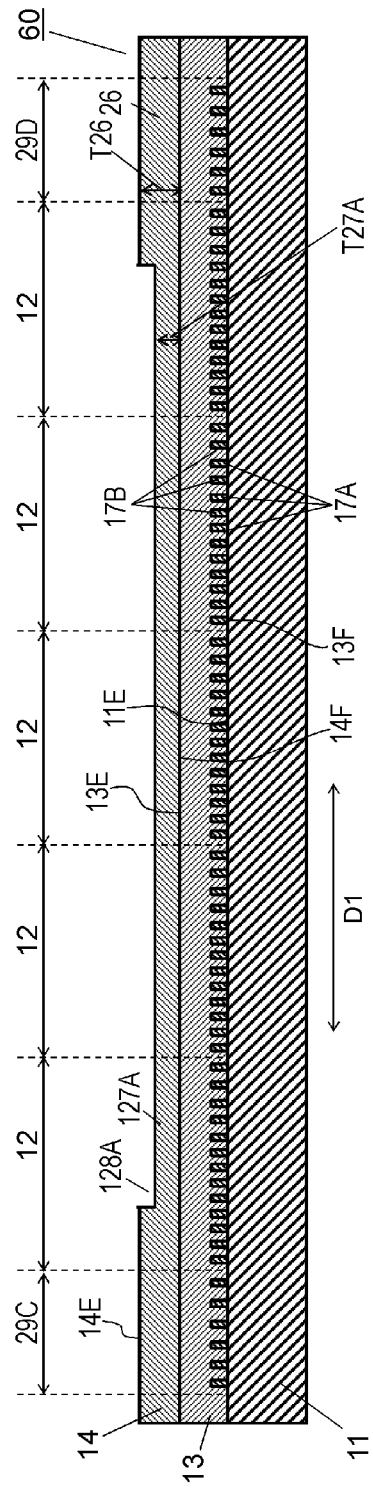
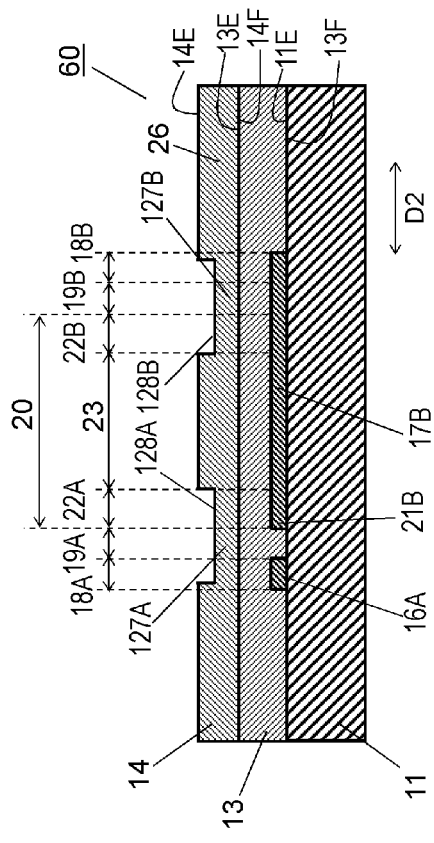
Fig. 8A
Fig. 8B

ACOUSTIC WAVE DEVICE

TECHNICAL FIELD

The present invention relates to an acoustic wave device to be used for a filter and an antenna duplexer in telecommunication equipment.

BACKGROUND ART

An acoustic wave device employing a 42-degree rotated Y-cut lithium tantalite board is often used for a filter and an antenna duplexer of telecommunication equipment. In recent years, a high performance acoustic wave device having a preferable temperature characteristic is demanded. To realize the acoustic wave device, a silicon dioxide film is deposited on an IDT electrode on a lithium niobate piezoelectric substrate to improve the temperature characteristic. Particularly, an acoustic wave device using lithium niobate having a cut angle to make a Rayleigh wave as a main acoustic wave is expected to realize a high resonance Q.

In this acoustic wave device, however, spurious emission is produced since, for instance, a spurious emission is caused by a higher-order transverse mode signal and other spurious emission is caused by an unwanted wave signal other than the Rayleigh wave of the main acoustic wave, deteriorating a passband characteristic of a filter.

Japanese Patent Laid-Open Publication No. 2011-101350 describes a conventional acoustic wave device which suppresses spurious emissions caused by a higher-order transverse mode out of various spurious emissions.

This acoustic wave device suppresses the higher-order transverse mode spurious, but does not sufficiently suppress spurious emission caused by the unwanted wave signal other than the main acoustic wave signal.

SUMMARY

An acoustic wave device includes a piezoelectric substrate, an interdigital transducer (IDT) electrode provided on an upper surface of the piezoelectric substrate, a first dielectric film covering the upper surface of the piezoelectric substrate to cover the IDT electrode, and a second dielectric film covering an upper surface of the first dielectric film. The IDT electrode is configured to excite an acoustic wave propagating in a predetermined propagation direction. The IDT electrode includes first and second comb electrodes facing each other. The first comb electrode includes a first bus bar and first electrode fingers extending from the first bus bar toward the second comb electrode. The second comb electrode includes a second bus bar and second electrode fingers extending from the second bus bar toward the first comb electrode such that the second electrode fingers interdigitate with the first electrode fingers. Tip portions of the second electrode fingers facing the first comb electrode provide a first tip region extending in the propagation direction. Tip portions of the first electrode fingers provide a second tip region extending in the propagation direction. A middle region is provided between the first and second tip regions. The second dielectric film includes a first thin portion positioned in the first tip region, a second thin portion positioned in the second tip region, and a thick portion which is positioned in the middle region and is thicker than the first and second thin portions.

The acoustic wave device suppresses spurious emission and has superior passband characteristics.

BRIEF DESCRIPTION OF DRAWINGS

FIG. 4A is a cross-sectional view of the acoustic wave device at line 4A-4A shown in FIG. 3.

FIG. 4B is a cross-sectional view of the acoustic wave device at line 4B-4B shown in FIG. 3.

FIG. 5 is a top view of an acoustic wave device according to Exemplary Embodiment 3 of the invention.

FIG. 8A is a cross-sectional view of the acoustic wave device at line 8A-8A shown in FIG. 7.

FIG. 8B is a cross-sectional view of the acoustic wave device at line 8B-8B shown in FIG. 7.

DETAIL DESCRIPTION OF PREFERRED EMBODIMENTS

Exemplary Embodiment 1

Figure 1:
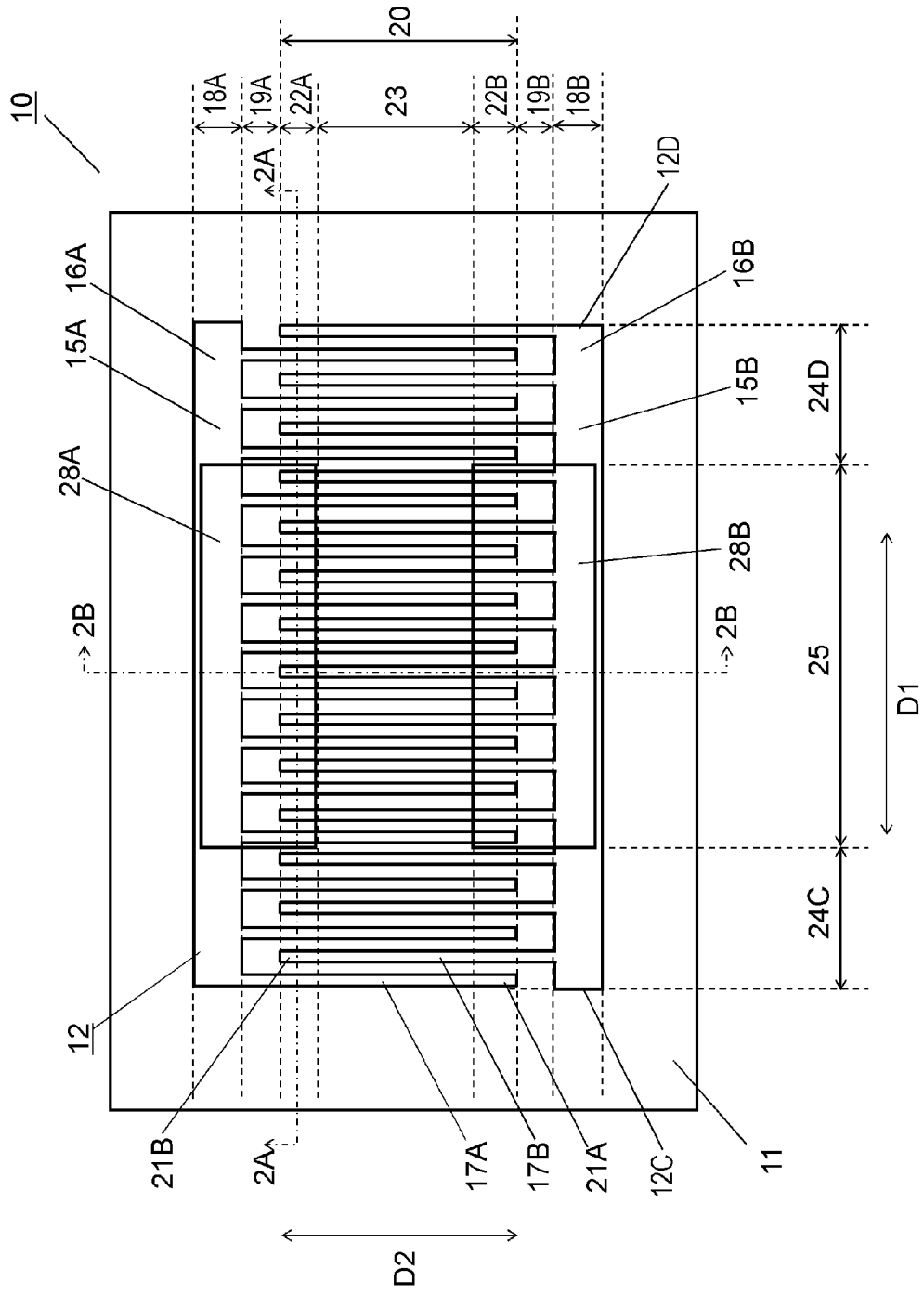
FIG. 1 is a top view of an acoustic wave device according to Exemplary Embodiment 1 of the present invention.
Figure 2A:
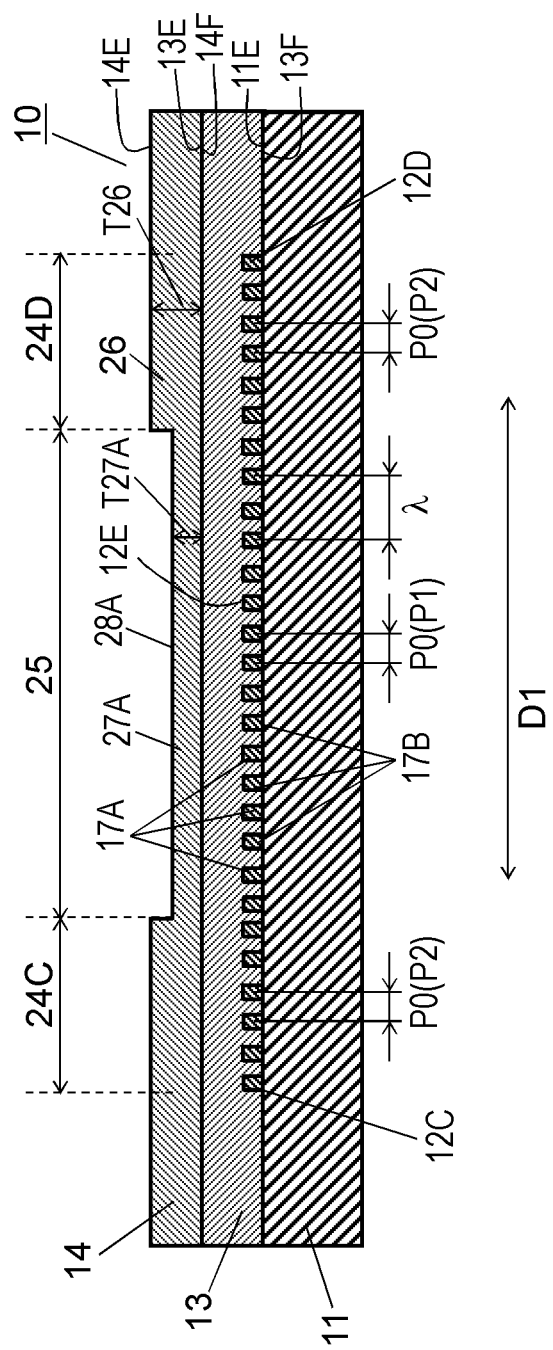
FIG. 2A is a cross-sectional view of the acoustic wave device at line 2A-2A shown in FIG. 1.
Figure 2B:
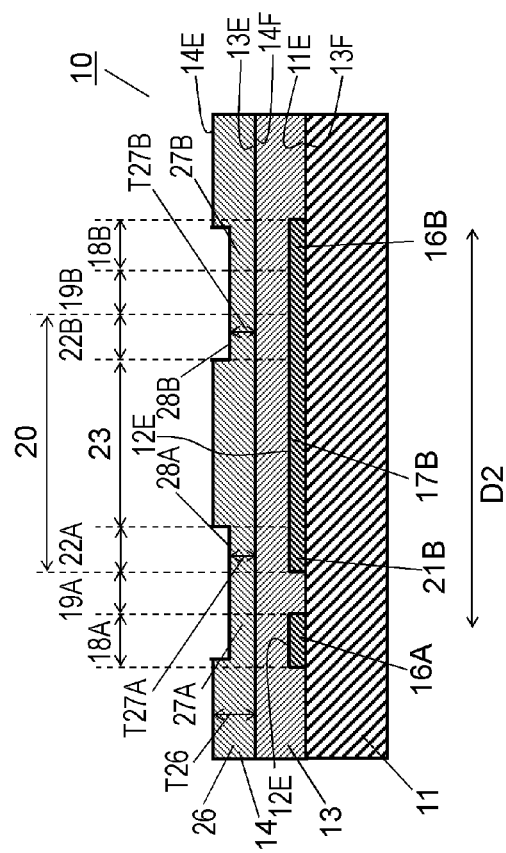
FIG. 2B is a cross-sectional view of the acoustic wave device at line 2B-2B shown in FIG. 1.

FIG. 1 is a schematic top view of acoustic wave device 10 according to Exemplary Embodiment 1 of the present invention. FIG. 2A is a cross-sectional view of acoustic wave device 10 at line 2A-2A shown in FIG. 1. FIG. 2B is a cross-sectional view of acoustic wave device 10 at line 2B-2B shown in FIG. 1.

Acoustic wave device 10 includes piezoelectric substrate 11, interdigital transducer (IDT) electrode 12 provided on upper surface 11E of piezoelectric substrate 11, dielectric film 13 provided on upper surface 12E of IDT electrode 12, and dielectric film 14 provided on upper surface 13E of dielectric film 13. Dielectric film 13 covers upper surface 11E of piezoelectric substrate 11 to cover IDT electrode 12. IDT electrode 12 includes a pair of comb electrodes 15A and 15B facing each other. Comb electrode 15A includes bus bar 16A and electrode fingers 17A extending from bus bar 16A toward comb electrode 15B in extending direction D2. Comb electrode 15B includes bus bar 16B and electrode fingers 17B extending from bus bar 16B toward comb electrode 15A in direction D2 such that electrode fingers 17B interdigitate with the electrode fingers 17A.

Electrode fingers 17A, 17B extend in extending direction D2 on upper surface 11E of piezoelectric substrate 11. IDT electrode 12 is configured to excite an acoustic wave in predetermined propagation direction D1. Propagation direction D1 is perpendicular to extending direction D2. A main acoustic wave out of acoustic waves excited by IDT electrode 12 is a main acoustic wave, and is, e.g. a Rayleigh wave.

Each of electrode fingers 17A of comb electrode 15A includes tip portion 21A facing bus bar 16B of comb electrode 15B in extending direction D2. Each of electrode fingers 17B of comb electrode 15B includes tip portion 21B facing bus bar 16A of comb electrode 15A in extending direction D2.

IDT electrode 12 defines bus bar region 18A including bus bar 16A and extending in propagation direction D1, and bus bar region 18B including bus bar 16B and extending in propagation direction D1. IDT electrode 12 further defines gap region 19A between tip portion 21B of each of electrode fingers 17B and bus bar 16A facing tip portion 21B of each electrode fingers 17B. Gap region 19A extends in propagation direction D1. IDT electrode 12 further defines gap region 19B between tip portion 21A of each of electrode fingers 17A and bus bar 16B facing tip portion 21A of each electrode fingers 17A. Gap region 19B extends in propagation direction D1. IDT electrode 12 further defines interdigitating region 20 in which electrode fingers 17A and 17B of comb electrodes 15A and 15B are arranged alternately in propagation direction D1.

IDT electrode 12 further defines tip region 22A in which tip portions 21B of electrode fingers 17B of comb electrode 15B are arranged in propagation direction D1. IDT electrode 12 further defines tip region 22B in which tip portions 21A of electro fingers 17A of comb electrodes 15A are arranged in propagation direction D1. IDT electrode 12 further defines middle region 23 between tip regions 22A and 22B in extending direction D2. Interdigitating region 20 thus includes middle region 23 between tip region 22A and 22B and tip regions 22A and 22B which are adjacent to gap region 19A and 19B in extending direction D2, respectively. IDT electrode 12 defines propagation end portions 24C and 24D and propagation center portion 25. Propagation end portions 24C and 24D include ends 12C and 12D of IDT electrode 12 opposite to each other in propagation direction D1, respectively. Propagation center portion 25 is a middle portion between propagation end portions 24C and 24D.

Dielectric film 13 is provided on upper surface 12E of IDT electrode 12 and a portion of upper surface 11E of piezoelectric substrate 11 where IDT electrode is not provided thereon. IDT electrode 12 is placed between piezoelectric substrate 11 and dielectric film 13. Dielectric film 13 is made of a medium through which a transverse wave propagates at a velocity lower than a velocity of the main acoustic wave propagating through upper surface 11E of piezoelectric substrate 11 in interdigitating region 20.

Dielectric film 14 is provided on upper surface 13E of dielectric film 13 to cover at least bus bar region 18A and 18B, gap region 19A and 19B, and interdigitating region 20. Dielectric film 14 is made of a medium through which a transverse wave propagates at a velocity higher than the velocity of the transverse wave propagates through dielectric film 13.

Dielectric film 14 includes thick portion 26 and thin portions 27A and 27B. Thickness of film portion 26 is larger than thin portions 27A and 27B. That is, thickness T26 of thick portion 26 from lower surface 14F to upper surface 14E of thick portion 26 is larger than thicknesses T27A and T27B of thin portions 27A and 27B from lower surface 14F to upper surface 14E of each of thin portions 27A and 27B. Thick portion 26 is positioned in middle region 23. Thick portion 26 of dielectric film 14 extends to tip regions 22A and 22B, gap regions 19A and 19B, and bus bar regions 18A and 18B within propagation end portions 24C and 24D. Thin portion 27A is positioned in tip region 22A, gap region 19A, and bus bar region 18A within propagation center portion 25 of IDT electrode 12. Thin portion 27B is positioned in tip region 22B, gap region 19 B, and bus bar region 18B within propagation center portion 25 of IDT electrode 12. Recesses 28A and 28B are provided in upper surface 14E of dielectric film 14 in thin portions 27A and 27B, respectively.

Widths of propagation end portions 24C and 24D of IDT electrode 12 in propagation direction D1 range preferably from 3% to 7% of a width of IDT electrode 12 in propagation direction D1. The widths of propagation end portions 24C and 24D of IDT electrode 12 in propagation direction D1 are preferably identical to each other. The width of propagation center portion 25 of IDT electrode 12 in propagation direction D1 is preferably 86% to 94% of the width of IDT electrode 12 in propagation direction D1.

In the above configuration, a displacement of a transverse mode stationary wave of the main acoustic wave in extending direction D2 within propagation center portion 25 of IDT electrode 12 increases approaching bus bar regions 16A and 16B from middle region 23. A displacement of the transverse mode stationary wave of the main acoustic wave in extending direction D2 within propagation end portions 24C and 24D of IDT electrode 12 increases as approaching middle region 23 from bus bar regions 16A and 16B. The distribution of the displacements is thus different between propagation center portion 25 and each of propagation end portions 24C and 24D. This distribution allows electric charges caused in electrode fingers 17A and 17B at a higher-order transverse mode, and suppresses higher-order transverse mode spurious emissions. Thus, spurious emissions caused by resonances of acoustic waves other than the main acoustic wave are suppressed. More specifically, in the case that the main acoustic wave is a Rayleigh wave, shear horizontal (SH) waves are also excited as unwanted waves. Vibration caused by the SH waves concentrate on surfaces of dielectric films 13 and 14 covering piezoelectric substrate 11, so that the SH waves may be affected significantly by surface structures of dielectric films 13 and 14. Thicknesses of dielectric films 13 and 14 on piezoelectric substrate 11 is determined such that the SH waves may not be excited in middle region 23 of interdigitating region 20. Displacements of the SH waves are therefore concentrate on tip regions 22A and 22B of interdigitating region 20 where the SH waves are easily excited. In tip regions 22A and 22B of acoustic wave device 10, thin portions 27A and 27B of dielectric film 14 is provided within propagation center portion 25 while thick portion 25 is provided within propagation end portions 24C and 24D. A propagation velocity of the acoustic wave in thin portions 27A and 27B is different from that in thick portion 26. Since the regions having different propagation velocities of the acoustic wave are formed, resonance of the SH waves is weakened and spurious emissions due to the resonance of the acoustic waves, such as the SH waves, other than the main acoustic wave are suppressed. Electrode fingers 17A and 18B of IDT electrode 12 are arranged at predetermined pitches P0 in propagation direction D1. Each pitch P0 is a distance between respective centers of electrode fingers 17A and 17B adjacent to each other in propagation direction D1. The spurious emissions are effectively suppressed by the arrangement in which arranging electrode fingers 17A and 17B of IDT electrode 12 within propagation end portions 24C and 24D at pitches P2 smaller than pitches P2 at which electrode fingers 17A and 17B within propagation center portion 25 arranged compared to the arrangement in which electrode fingers 17A and 17B of IDT electrode 12 are arranged at identical pitches P0. Pitches P0 between electrode fingers 17A and 17B may preferably decrease gradually and monotonically as approaching propagation end portions 24C and 24D from propagation center portion 25. The arrangement of IDT electrode 12 in which all electrode fingers 17A and 17B are arranged in identical pitches, a displacement of a standing wave concentrates in propagation center portion 25. In the case that pitches P2 in propagation end portions 24C, and 24D are smaller than pitches P1 in propagation center portion 25, the displacement of the standing wave is uniform entirely above IDT electrode 12.

Thus, predetermined pitches P2 (P0) of electrode fingers 17A and 17b in propagation end portions 24C and 24D are smaller than predetermined pitches P1 (P0) in propagation center portion 25. Predetermined pitches P0 between electrode fingers 17A and 17B may be preferably decreases monotonically as approaching ends 12C and 12D of IDT electrode 12 in propagation direction D1 from a center portion of IDT electrode 12 between ends 12C and 12D.

The configuration of acoustic wave device 10 according to Embodiment 1 will be described below. Piezoelectric substrate 11 may be a lithium niobate substrate having a positive anisotropic index $\gamma(\gamma>0)$ in propagation direction D1. The substrate according to Embodiment 1 is made of lithium niobate ($LiNbO_3$). A piezoelectric substrate having a positive anisotropic index $\gamma$ is a piezoelectric substrate in which an inverse velocity surface in propagation direction D1 of the main acoustic wave is a convex surface. More specifically, piezoelectric substrate 11 is made of, e.g. rotated Y-cut X-propagation lithium niobate ($LiNbO_3$). In the case that the main acoustic wave is a Rayleigh wave, piezoelectric substrate 11 is preferably made of lithium niobate ($LiNbO_3$) substrate of 125° to 131° rotated Y-cut X-propagation.

IDT electrode 12 is made of metal, such as aluminum, copper, silver, gold, titan, tungsten, platinum, chrome, of molybdenum, an alloy mainly containing these metals, or a laminated structure of layers of these metals. The thickness of IDT electrode 12 from upper surface 11E of piezoelectric substrate 11 to upper surface 12E of IDT electrode 12 is expressed by wavelength $\lambda$ determined by pitches P0 between electrode fingers 17A and 17B of comb electrodes 15A and 15B, and ranges from about $0.01\lambda$ to $0.2\lambda$ according to Embodiment 1. Wavelength $\lambda$ is a distance between respective centers of electrode fingers 17A adjacent to each other in propagation direction D1, and is a distance between respective centers of electrode fingers 17B adjacent to each other in propagation direction D1

Widths of gap regions 19A and 19B in extending direction D2, i.e., a distance between tip portion 21B of electrode finger 17B and bus bar 16A of comb electrode 15A and a distance between tip portion 21A of electro finger 17A and bus bar 16B of comb electrode 15B range from about $0.25\lambda$ to $0.95\lambda$. The widths of gap regions 19A and 19B more than $1\lambda$ increase an insertion loss due to a resistance loss of electrode fingers 17A and 17B. The widths of gap regions 19A and 19B less than $0.25\lambda$ produce an insertion loss due to a leakage of the main acoustic wave from electrode fingers 17A and 17B in extending direction D2. The widths of gap regions 19A and 19B in extending direction D2 are preferably not smaller than $0.25\lambda$ and not larger than $0.95\lambda$.

Dielectric film 13 is made of, e.g. tantalum pentoxide ($Ta_2O_5$), tellurium dioxide ($TeO_2$), or silicon dioxide ($SiO_2$). However, this material is not limited to these. The film may be made of other insulating medium through which the transverse wave can propagate at a velocity lower than a velocity at which the main acoustic wave propagates in interdigitating region 20. The propagation velocity of the acoustic wave in silicon dioxide ($SiO_2$) has a temperature dependence reverse to a temperature dependence of a velocity of the acoustic wave in piezoelectric substrate 11. Hence, silicon dioxide improves a temperature characteristic of acoustic wave device 10 and is suitable to a material of dielectric film 13. Dielectric film 13 upon being made of silicon dioxide ($SiO_2$) has a thickness preferably ranging from $25\lambda$ to $40\lambda$ from lower surface 13F to upper surface 13E of dielectric film 13.

Figure 2C:
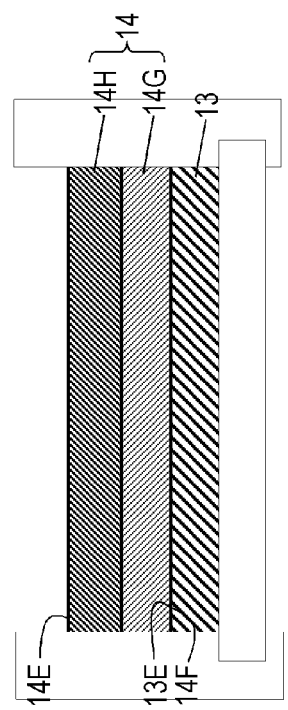
FIG. 2C is a cross-sectional view of a dielectric layer of the acoustic wave device according to Embodiment 1.

Dielectric film 14 may include layers made of dielectric materials, such as silicon nitride ($Si_3N_4$), nitride oxide (SiON), or aluminum nitride (AlN). FIG. 2C is a cross-sectional view of another dielectric film 14 of acoustic wave device 10 according to Embodiment 1. Dielectric film 14 shown in FIG. 2C includes different layers 14G and 14H stacked on each other. Layer 14G and 14H are made of dielectric materials out of the above mentioned materials different from each other. Dielectric film 14 is made of a medium in which a transverse wave propagates at a velocity higher than a velocity at which the transverse wave propagates in dielectric film 13. Silicon nitride ($Si_3N_4$) allows a transverse wave to propagate therein at a high velocity, and functions as a passivation film preventing permeation of water, thus being suitable to material of dielectric film 14. In dielectric film 14 made of silicon nitride ($Si_3N_4$), thick portion 26 has a thickness from lower surface 14F to upper surface 14E is preferably not smaller than $0.007\lambda$ and not larger than $0.018\lambda$ while thin portions 27A and 27B has thicknesses preferably not smaller than $0.002\lambda$ and not larger than $0.005\lambda$.

In tip regions 22A and 22B, a propagation velocity of the main acoustic wave in propagation end portions 24C and 24D having thick portion 26 of dielectric film 14 placed therein is different from a propagation velocity of the main acoustic wave in propagation center portion 25 having thin portions 27A and 27B of dielectric film 14 placed therein. In acoustic wave device 10 according to Embodiment 1, the propagation velocity of the main acoustic wave in thick portion 26 is higher than that in thin portions 27A and 27B by a difference ranging from 30 m/s to 60 m/s. The difference of the velocities which is not larger than 30 m/s can not suppress spurious emissions sufficiently. The difference not smaller than 60 m/s may cause the frequency characteristic to be affected excessively by the thickness of dielectric film 14, thus providing too large variations of propagation characteristics against a frequency to obtain a desired frequency characteristic.

Widths of tip regions 22A and 22B in extending direction D2 range preferably from $0.5\lambda$ to $3\lambda$. This configuration can suppress a higher-order transverse mode spurious emission caused by the main acoustic wave and spurious emissions caused by acoustic waves other than the main acoustic wave as well, thus providing acoustic wave device 10 with superior passband characteristics.

Recesses 28A and 28B in dielectric thin film 14, i.e., thin portions 27A and 27B may extend to above gap regions 19A and 19B and bus bar regions 18A and 18B, respectively.

Recesses 28A and 28B of dielectric film 14 may be formed by applying dielectric film 14 entirely on upper surface 13E of dielectric film 13 and then removing, by dry etching or wet etching, portions of the applied film where recesses 28A and 28B. Alternatively, recesses 28A and 28B may be formed by applying a resist pattern onto positions where recesses 28A and 28B are formed, forming dielectric film 14, and then lifting the pattern off. Forming recesses 28A and 28B by dry etching reduces the number of production processes, and raising production efficiency accordingly.

Exemplary Embodiment 2

Figure 3:
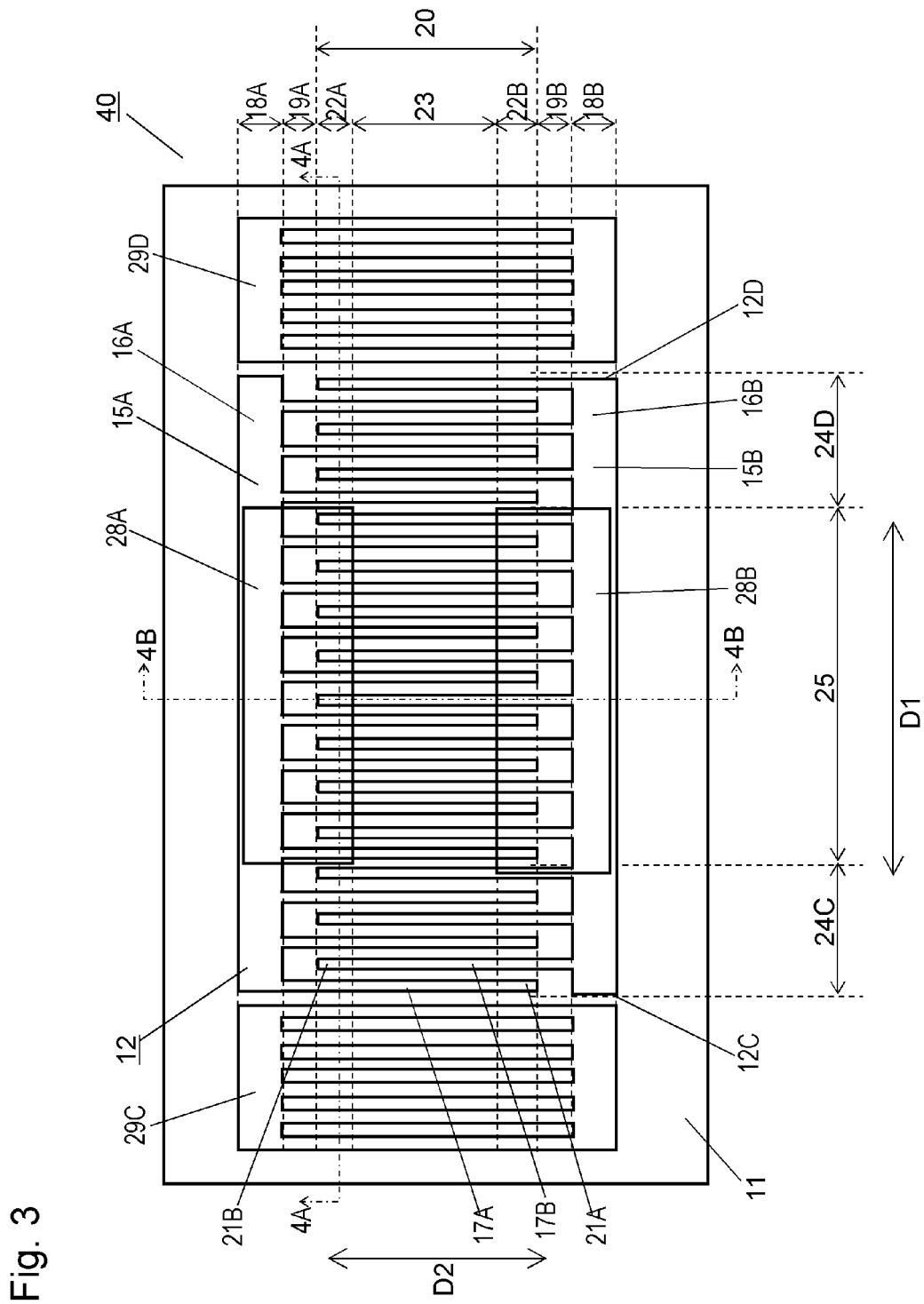
FIG. 3 is a top view of an acoustic wave device according to Exemplary Embodiment 2 of the invention.

FIG. 3 is a schematic depiction of a top view of acoustic wave device 40 according to Exemplary Embodiment 2 of the present invention. FIG. 4A is a schematic cross-sectional view of acoustic wave device 40 at line 4A-4A shown in FIG. 3. FIG. 4B is a schematic cross-sectional view of acoustic wave device 40 at line 4B-4B shown in FIG. 3.

In FIGS. 3, 4A and 4B, components identical to those of acoustic wave device 10 according to Embodiment 1 shown in FIGS. 1, 2A and 2B are denoted by the same reference numerals.

Acoustic wave device 40 according to Embodiment 2 is a one-terminal-pair resonator further including reflectors 29C and 29D provided at ends of IDT electrode 12 opposite to each other in propagation direction D1. Thus, IDT electrode 12 is provided between reflectors 29C and 29D in propagation direction D1.

Reflectors 29C and 29D reflect the main acoustic wave to confine the main acoustic wave in acoustic wave device 40. Reflectors 29C and 29D are made of material identical to that of IDT electrode 12. Dielectric film 13 also covers reflectors 29C and 29D, and dielectric film 14 is provided on upper surface 13E of dielectric film 13. Thick portion 26 of dielectric film 14 extends to above reflectors 29C and 29D, but thin portions 27A and 27B do not extend to above reflectors 29C and 29D. If thin portions 27A and 27B extend to above reflectors 29C and 29D in tip regions 22A and 22B and gap regions 19A and 19B, the highest frequency of a stopband of reflectors 29C and 29D decreases, and narrows the width of the stopband, consequently allowing the main acoustic wave to leak and causing a loss and a spurious emission.

As described above, acoustic wave device 40 according to Embodiment 2 decreases higher-order transverse mode spurious emissions as well as the spurious emission caused by the stopband of reflectors 29C and 29D, providing a resonance characteristic with a small spurious emission.

Exemplary Embodiment 3

Figure 6A:
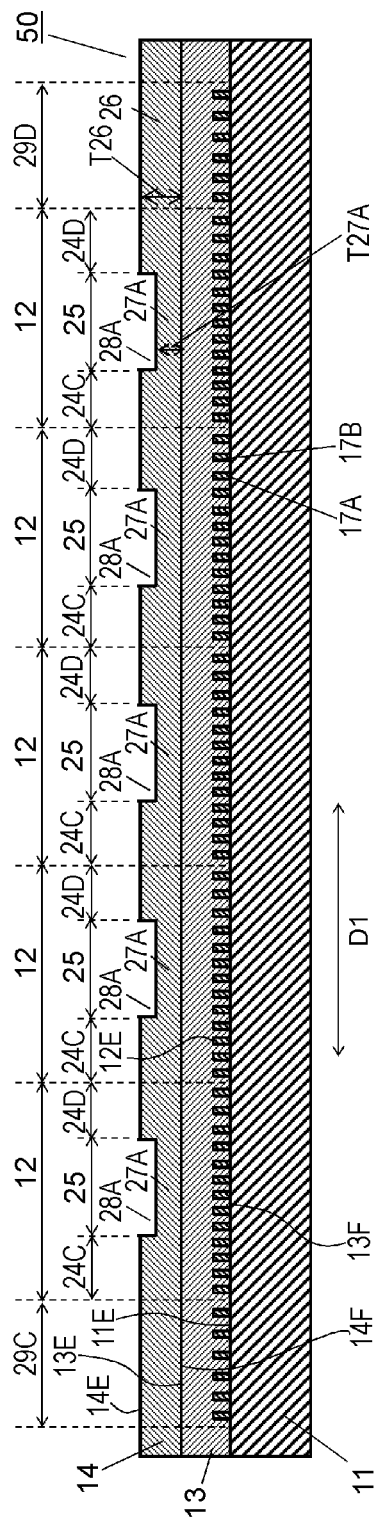
FIG. 6A is a cross-sectional view of the acoustic wave device at line 6A-6A shown in FIG. 5.
Figure 6B:
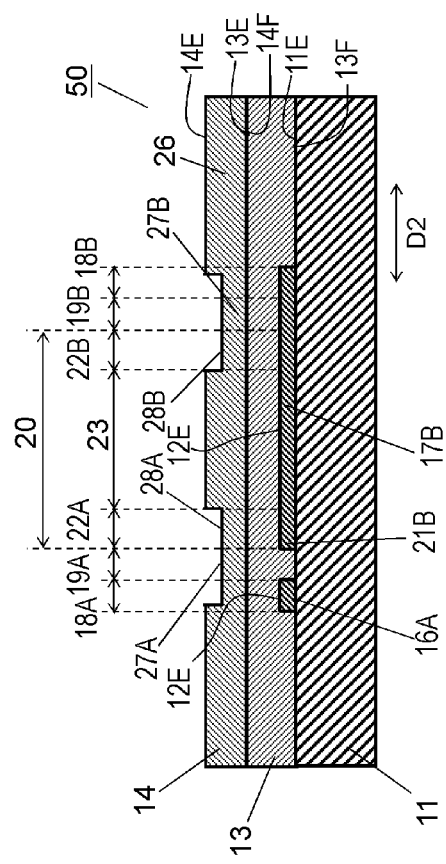
FIG. 6B is a cross-sectional view of the acoustic wave device at line 6B-6B shown in FIG. 5.
Figure 7:
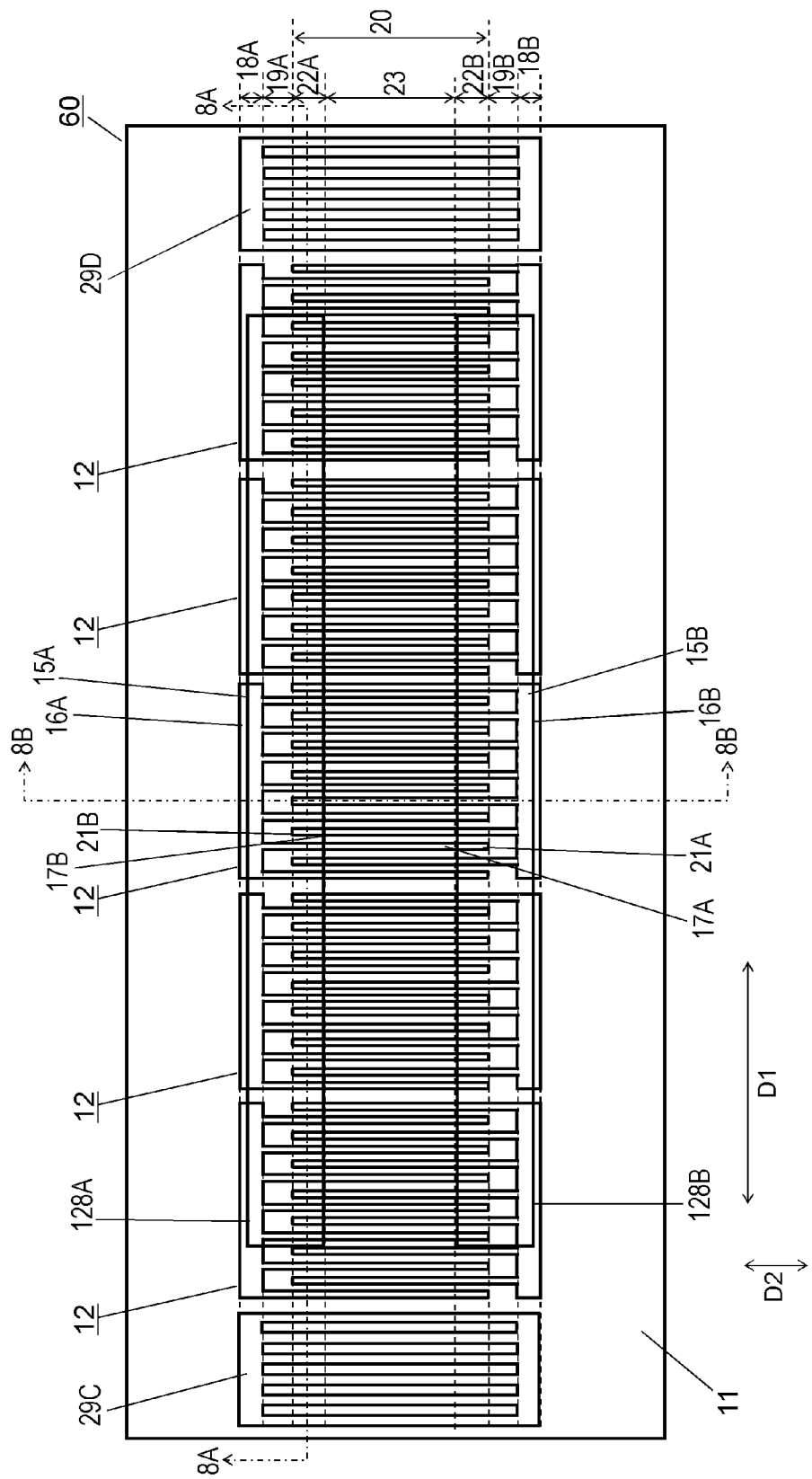
FIG. 7 is a top view of a comparative example to an acoustic wave device.

FIG. 5 is a top view of acoustic wave device 50 according to Exemplary Embodiment 3 of the present invention. FIG. 6A is a cross-sectional view of acoustic wave device 50 at line 6A-6A shown in FIG. 5. FIG. 6B is a cross-sectional view of acoustic wave device 50 at line 6B-6B shown in FIG. 5. FIG. 7 is a top view of a comparative example, acoustic wave device 60. FIG. 8A is a cross-sectional view of acoustic wave device 60 at line 8A-8A shown in FIG. 7. FIG. 8B is a cross-sectional view of acoustic wave device 60 at line 8B-8B shown in FIG. 7. In FIGS. 5, 6A, 6B, 7, 8A and 8B, components identical to those of acoustic wave device 40 according to Embodiment 2 shown in FIGS. 3, 4A and 4B are denoted by the same reference numerals. Acoustic wave devices 50 and 60 are longitudinally-coupled acoustic wave filters in which IDT electrodes 12 are arranged between reflector 29C and 29D in propagation direction D1.

Each of acoustic wave devices 50 and 60 includes piezoelectric substrate 11, five IDT electrodes 12, a pair of reflectors 29C and 29D, dielectric film 13, and dielectric film 14. IDT electrodes 12 excite a surface acoustic wave, such as a Rayleigh wave on, piezoelectric substrate 11. Five IDT electrodes 12 and reflectors 29C and 29D are arranged in propagation direction D1 of a main acoustic wave. All IDT electrodes 12 are made of identical material and have a structure identical to that of the IDT electrode of acoustic wave device 40 according to Embodiment 2. Although all IDT electrodes 12 of each of acoustic wave devices 50 and 60 may have different design values in dimension of bus bars 16A and 16B, the number of electrode fingers 17A and 17B, directions of electrode fingers 17A and 17B, and the dimension and pitches of electrode fingers 17A and 17B, acoustic wave device 50 according to Embodiment 3 and acoustic wave device 60 of the comparative example have the above design values in IDT electrode 12 and reflectors 29C and 29D identical to each other for comparison.

In acoustic wave devices 50 and 60, piezoelectric substrate 11 is made of a 128°-rotated Y-cut X-propagation lithium niobate substrate. Each of IDT electrode 12 and reflectors 29C and 29D is a laminated electrode including a molybdenum (Mo) layer made of molybdenum provided on upper surface 11E of piezoelectric substrate 11 and an aluminum (Al) layer made of aluminum provided on an upper surface of the molybdenum layer. The molybdenum layer has a thickness of $0.05\lambda$ while the aluminum layer has a thickness of $0.08\lambda$. Dielectric film 13 is made of silicon dioxide ($SiO_2$) and has a film thickness of $0.34\lambda$. Dielectric film 14 is made of silicon nitride ($Si_3N_4$). Thin portions 27A and 27B have a film thickness of $0.002\lambda$ while thick portion 26 has a film thickness of $0.012\lambda$. In each of acoustic wave devices 50 and 60, bus bar regions 18A and 18B, gap regions 19A and 19B, interdigitating region 20, tip end portions 21A and 21B, tip regions 22A and 22B, middle region 23, propagation end portions 24C and 24D, and propagation center portion 25 are defined identically to those of acoustic wave devices 10 and 40 according to Embodiments 1 and 2 shown in FIGS. 1 to 4B.

Acoustic wave device 50 according to Embodiment 3 is different from the comparative example of acoustic wave device 60 in the arrangement of thin portions 27A and 27B and thick portion 26 of dielectric film 14. Dielectric film 14 of the comparative example of acoustic wave device 60 includes thin portions 127A and 128B instead of thin portions 27A and 27B of acoustic wave device 50 according to Embodiment 3. Thin portions 127A and 127B are implemented by recesses 128A and 128B provided in upper surface 14E of dielectric film 14, respectively.

Dielectric film 14 of acoustic wave device 50 according to Embodiment 3 includes thin portions 27A formed in tip region 22A within propagation center portion 25 of each of five IDT electrodes 12 while thin portion 27B is formed in tip region 22B within propagation center portion 25 of each of five IDT electrodes 12. Thick portion 26 is further formed in tip regions 22A and 22B within propagation end portions 24C and 24D of each of five IDT electrodes 12. Thin portions 27A formed above each of five IDT electrodes 12 are located away from each other while thin portions 27B formed above each of five IDT electrodes are located away from each other. Each of five thin portions 27A in upper surface 14E of dielectric film 14 is implemented by respective one of recesses 28A while each of five thin portions 27B in upper surface 14E of dielectric film 14 is implemented by respective one of recesses 28B. Five recesses 28A formed above respective ones of five IDT electrodes are located away from each other while five recesses 28B formed above respective ones of five IDT electrodes are located away from each other. In acoustic wave device 50, thick portion 26 is continually formed in whole middle region 23. Thin portion 27A (recess 28A) is formed in gap region 19A and bus bar region 18A within propagation center portion 25 of each of five IDT electrodes 12 while thin portion 27B (recess 28B) is formed in gap region 19B and bus bar region 18B within propagation center portion 25 of each of five IDT electrodes 12. In acoustic wave device 50, a width of each of propagation end portions 24C and 24D of IDT electrode 12 in propagation direction D1 of the main acoustic wave ranges within 5±2% of the width of IDT electrode 12 in propagation direction D1. The width of propagation center portion 25 of IDT electrode 12 in propagation direction D1 of the main acoustic wave ranges within 90±4% of the width of IDT electrode 12 in propagation direction D1.

In the comparative example of acoustic wave device 60, thin portion 127A of dielectric film 14 is formed continually through tip region 22A, gap region 19A, and bus bar region 18A of each of IDT electrodes 12. Thin portion 127B is formed continually through tip region 22B, gap region 19B, and bus bar region 18B of each of IDT electrodes 12. Thick portion 26 is formed in entire middle region 23. Thin portions 127A and 127B are continually formed in gap regions 19A and 19B and bus bar regions 18A and 18B above each of five IDT electrodes 12, respectively.

Figure 9A:
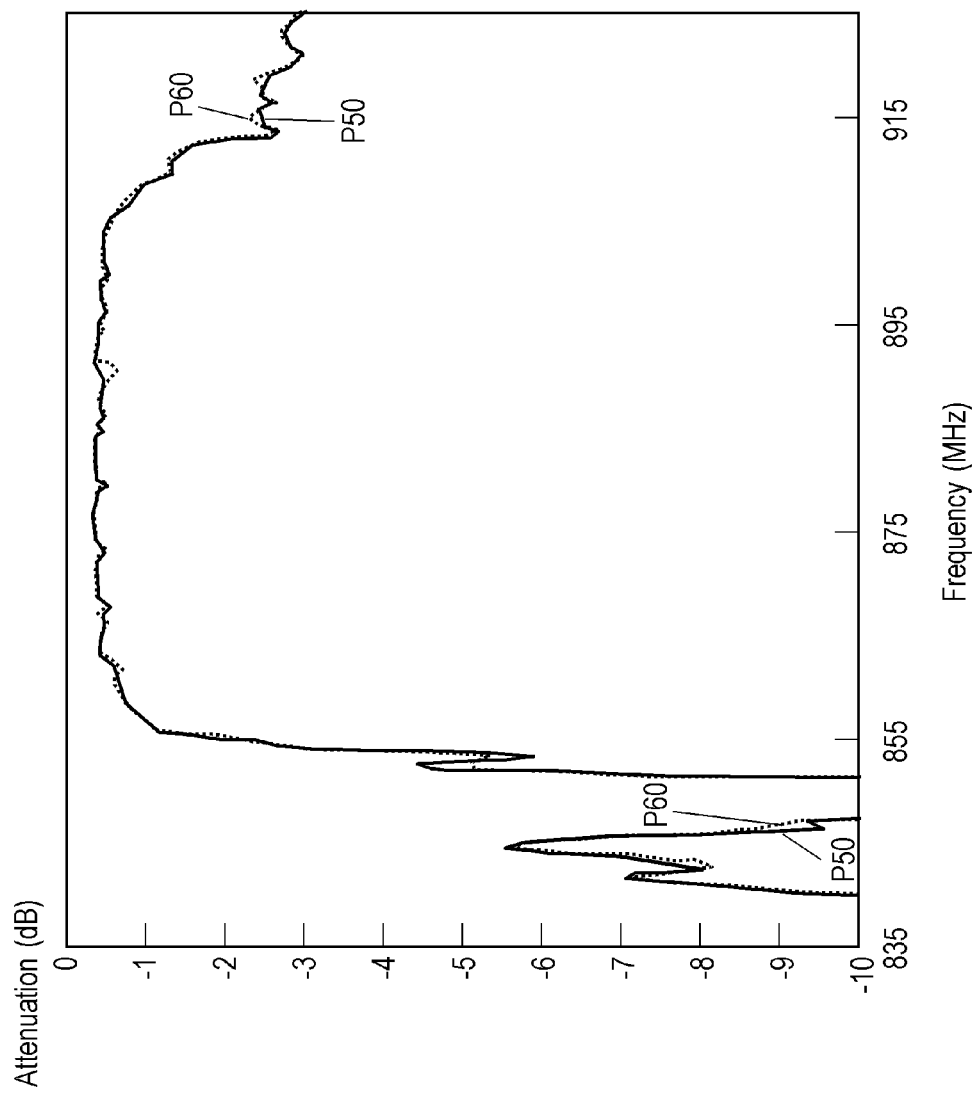
FIGS. 9A and 9B are characteristic charts of the acoustic wave device according to Embodiment 3.
Figure 9B:
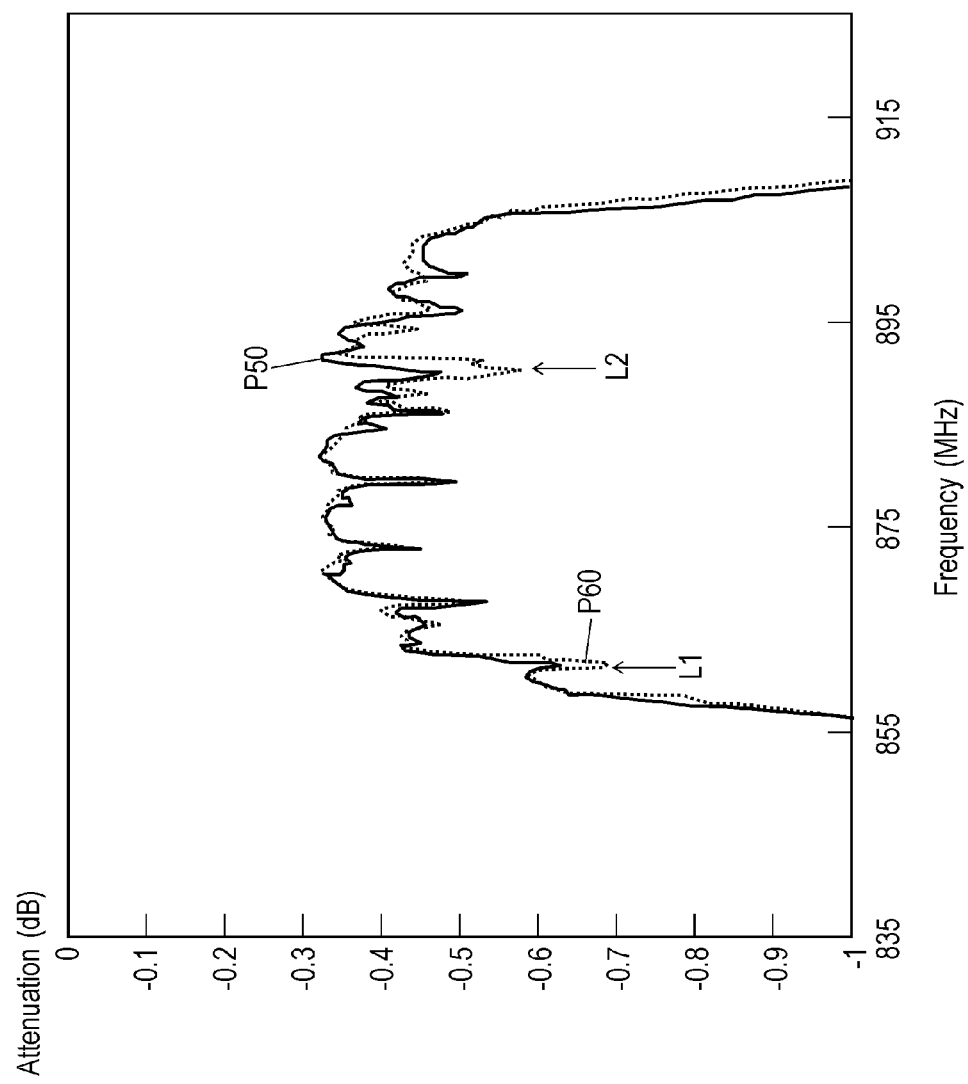

FIGS. 9A and 9B show passband characteristic P50 of acoustic wave device 50 according to Embodiment 3 and passband characteristic P60 of the comparative example of acoustic wave device 60. In each of FIGS. 9A and 9B, the vertical axis represents attenuation, and the horizontal axis represents a frequency. FIG. 9B shows the characteristics on the vertical axis of FIG. 9A enlarged.

As shown in FIG. 9B, passband characteristics P50 and P60 exhibit ripple L1 caused by an unwanted SH wave. SH wave ripple L1 is smaller in passband characteristic P50 of acoustic wave device 50 according to Embodiment 3 than in passband characteristic P60 of the comparative example of acoustic wave device 60. Passband characteristics P50 and P60 further exhibit ripple L2 caused by a higher-order transverse mode spurious emission. Higher-order transverse mode ripple L2 is smaller in passband characteristic P50 of acoustic wave device 50 than in passband characteristic P60 of the comparative example of acoustic wave device 60.

As described above, acoustic wave device 50 according to Embodiment 3 has a filter characteristic with a small ripple.

The acoustic wave devices according to Embodiment 1 to 3 has superior advantage in suppressing the higher-order transverse mode spurious emissions caused by the main acoustic wave as well as the spurious emissions caused by the acoustic wave other than the main acoustic wave. The acoustic wave devices are particularly applicable to filters and antenna duplexers of mobile communications equipment, providing superior filter characteristics in passband frequencies.

In the exemplary embodiments, terms, such as "upper surface" and "above", indicating directions merely indicate relative directions depending on a relative positional relationship of constituent components of the acoustic wave devices, and do not indicate absolute directions, such as a vertical direction.

What is claimed is:

1. An acoustic wave device comprising:
   a piezoelectric substrate;
   an interdigital transducer (IDT) electrode provided on an upper surface of the piezoelectric substrate, the IDT electrode being configured to excite an acoustic wave propagating in a predetermined propagation direction;
   a first dielectric film covering the upper surface of the piezoelectric substrate to cover the IDT electrode; and
   a second dielectric film covering an upper surface of the first dielectric film,
   wherein the IDT electrode includes a first comb electrode and a second comb electrode facing each other,
   wherein the first comb electrode includes a first bus bar and a plurality of first electrode fingers extending from the first bus bar toward the second comb electrode,
   wherein the second comb electrode includes a second bus bar and a plurality of second electrode fingers extending from the second bus bar toward the first comb electrode, such that the plurality of second electrode fingers interdigitate with the plurality of first electrode fingers,
   wherein each of the plurality of first electrode fingers includes a first tip portion facing the second bus bar,
   wherein each of the plurality of second electrode fingers includes a second tip portion facing the first bus bar,
   wherein the IDT electrode defines:
      a first tip region including the second tip portion of each of the plurality of second electrode fingers, the first tip region extending in the propagation direction;
      a second tip region including the first tip portion of each of the plurality of first electrode fingers, the second tip region extending in the propagation direction; and
      a middle region positioned between the first tip region and the second tip region, the middle region extending in the propagation direction, and
   wherein the second dielectric film includes:
      a first thin portion positioned in the first tip region;
      a second thin portion positioned in the second tip region; and
      a thick portion positioned in the middle region, the thick portion being thicker than the first thin portion and the second thin portion.

2. The acoustic wave device according to claim 1, wherein the second dielectric film includes a plurality of different layers stacked on each other.

3. The acoustic wave device according to claim 1,
   wherein the IDT electrode defines:
      first and second propagation end portions including first and second ends of the IDT electrode opposite to each other in the propagation direction, respectively; and
      a propagation center portion positioned between the first and second propagation end portions,
   wherein the first thin portion and the second thin portion are positioned above the first tip region and the second tip region in the propagation center portion, respectively, and
   wherein the thick portion extends to above the first tip region and the second tip region in the first and second propagation end portions.

4. The acoustic wave device according to claim 1,
   wherein the plurality of first electrode fingers and the plurality of second electrode fingers are arranged at predetermined pitches along the propagation direction, and
   wherein, with regard to wavelength $\lambda$ determined by the predetermined pitches, the thick portion of the second dielectric film has a thickness not smaller than $0.007\lambda$ and not larger than $0.018\lambda$, and the first thin portion and the second thin portion of the second dielectric film have a thickness not smaller than $0.002\lambda$ and not larger than $0.005\lambda$.

5. The acoustic wave device according to claim 1,
   wherein the plurality of first electrode fingers and the plurality of second electrode fingers are arranged at predetermined pitches along the propagation direction, and
   wherein, with regard to wavelength $\lambda$ determined by the predetermined pitches, a distance between the first tip portion of each of the plurality of first electrode fingers and the second bus bar of the second comb electrode and a distance between the second tip portion of each of the plurality of second electrode fingers and the first bus bar of the first comb electrode are not smaller than $0.25\lambda$ and not larger than $0.95\lambda$.

6. The acoustic wave device according to claim 1, wherein the IDT electrode is made of metal containing molybdenum.

7. The acoustic wave device according to claim 1, wherein the second dielectric film is mainly made of silicon nitride.

8. The acoustic wave device according to claim 1, wherein a difference between a velocity of a main acoustic wave at the first tip region and the second tip region and a velocity of the main acoustic wave at the middle region range from 30 m/s to 60 m/s.

9. The acoustic wave device according to claim 1,
   wherein the IDT electrode defines:

first and second propagation end portions including first and second ends of the IDT electrode opposite to each other in the propagation direction, respectively; and a propagation center portion positioned between the first and second propagation end portions, wherein the plurality of first electrode fingers and the plurality of second electrode fingers are arranged at predetermined pitches along the propagation direction, and wherein values of the predetermined pitches in the first and second propagation end portions are smaller than values of the predetermined pitches in the propagation center portion.

10. The acoustic wave device according to claim 9, wherein the predetermined pitches decreases monotonically as approaching first and second ends of the IDT electrode opposite to each other in the propagation direction from a center portion between the first and second ends of the IDT electrode.

* * * * *